United States Patent
Steigerwald et al.

(10) Patent No.: US 9,705,047 B2
(45) Date of Patent: Jul. 11, 2017

(54) METHOD OF ATTACHING A LIGHT EMITTING DEVICE TO A SUPPORT SUBSTRATE

(71) Applicant: KONINKLIJKE PHILIPS N.V., Eindhoven (NL)

(72) Inventors: Daniel Alexander Steigerwald, Eindhoven (NL); Jerome Chandra Bhat, Eindhoven (NL); Salman Akram, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/066,237

(22) Filed: Mar. 10, 2016

(65) Prior Publication Data

US 2016/0197244 A1    Jul. 7, 2016

Related U.S. Application Data

(60) Division of application No. 14/869,625, filed on Sep. 29, 2015, which is a continuation of application No.
(Continued)

(51) Int. Cl.
*H01L 33/48* (2010.01)
*H01L 33/46* (2010.01)
(Continued)

(52) U.S. Cl.
CPC .......... *H01L 33/483* (2013.01); *H01L 25/075* (2013.01); *H01L 25/50* (2013.01);
(Continued)

(58) Field of Classification Search
CPC ..... H01L 33/483; H01L 33/507; H01L 33/62; H01L 33/46; H01L 33/0079;
(Continued)

(56) References Cited

U.S. PATENT DOCUMENTS 6,876,008 B2    4/2005    Bhat
9,153,758 B2    10/2015   Steigerwald et al.
(Continued)

FOREIGN PATENT DOCUMENTS

CN    1010277954 A    8/2007
CN    102057511 A     5/2011
(Continued)

OTHER PUBLICATIONS

International Preliminary Report on Patentability mailed Dec. 12, 2013 from International Application No. PCT/IB2012/052533 filed May 12, 2012.
(Continued)

*Primary Examiner* — Caridad Everhart

(57) ABSTRACT

A method according to embodiments of the invention includes providing a wafer of semiconductor light emitting devices, each semiconductor light emitting device including a light emitting layer sandwiched between an n-type region and a p-type region. A wafer of support substrates is provided, each support substrate including a body. The wafer of semiconductor light emitting devices is bonded to the wafer of support substrates. Vias are formed extending through the entire thickness of the body of each support substrate.

15 Claims, 4 Drawing Sheets

Related U.S. Application Data

14/118,564, filed as application No. PCT/IB2012/052533 on May 21, 2012, now Pat. No. 9,153,758.

(60) Provisional application No. 61/491,918, filed on Jun. 1, 2011.

(51) Int. Cl.
  *H01L 33/58* (2010.01)
  *H01L 33/62* (2010.01)
  *H01L 33/50* (2010.01)
  *H01L 25/075* (2006.01)
  *H01L 25/00* (2006.01)
  *H01L 33/00* (2010.01)

(52) U.S. Cl.
  CPC .............. *H01L 33/46* (2013.01); *H01L 33/50* (2013.01); *H01L 33/58* (2013.01); *H01L 33/62* (2013.01); *H01L 33/0079* (2013.01); *H01L 2224/16* (2013.01); *H01L 2933/0066* (2013.01)

(58) Field of Classification Search
  CPC ......... H01L 2224/16; H01L 2933/0066; H01L 33/50; H01L 25/075; H01L 25/50
  USPC ........................................ 438/28, 39, 38, 667
  See application file for complete search history.

(56) References Cited

U.S. PATENT DOCUMENTS

| | | | | |
|---|---|---|---|---|
| 2004/0125288 | A1* | 7/2004 | Jeong | G02F 1/133553 349/113 |
| 2004/0129991 | A1* | 7/2004 | Lai | H01L 31/0203 257/433 |
| 2006/0006404 | A1 | 1/2006 | Ibbetson | |
| 2007/0096130 | A1* | 5/2007 | Schiaffino | H01L 33/0079 257/98 |
| 2007/0262338 | A1* | 11/2007 | Higashi | H01L 33/38 257/99 |
| 2007/0284602 | A1 | 12/2007 | Chitnis et al. | |
| 2008/0035935 | A1 | 2/2008 | Shum | |
| 2009/0179207 | A1* | 7/2009 | Chitnis | H01L 33/44 257/88 |
| 2009/0236619 | A1* | 9/2009 | Chakroborty | H01L 33/44 257/89 |
| 2009/0274411 | A1 | 11/2009 | Bar | |
| 2009/0315965 | A1 | 12/2009 | Yamagata et al. | |
| 2010/0110157 | A1 | 5/2010 | Yonehara et al. | |
| 2010/0258827 | A1 | 10/2010 | Lee | |
| 2011/0073890 | A1* | 3/2011 | Sugizaki | H01L 33/0079 257/98 |
| 2011/0121291 | A1 | 5/2011 | Chen et al. | |
| 2011/0233587 | A1 | 9/2011 | Unno | |

FOREIGN PATENT DOCUMENTS

| | | |
|---|---|---|
| JP | 2004-356230 A | 12/2004 |
| JP | 2010-103186 | 5/2010 |
| JP | 2011-071273 | 4/2011 |

OTHER PUBLICATIONS

International Search Report and Written Opinion mailed Oct. 23, 2012 from International Application No. PCT/IB2012/052533 filed May 12, 2012.

Office Action issued Jan. 14, 2016 from ROC (Taiwan) Patent Application No. 101119214.

First Office Action mailed Dec. 11, 2015 from Chinese Patent Application No. 201280026933.7.

JP OA3MO, Application 2014-513276, Mar. 8, 2016 4 pps.

Second Office Action mailed May 24, 2016 from Chinese Patent Application No. 201280026933.7.

CN Office Action, Application 201280026933.7, Sep. 26, 2016, 16 pps.

JP Office Action, Application 2014-513276, Oct. 18, 2016, 4 pps.

* cited by examiner

METHOD OF ATTACHING A LIGHT EMITTING DEVICE TO A SUPPORT SUBSTRATE

CROSS-REFERENCE TO PRIOR APPLICATION

This application is a divisional of U.S. patent application Ser. No. 14/869,625, filed on Sep. 29, 2015, which is a continuation of U.S. patent application Ser. No. 14/118,564, filed on Apr. 21, 2014, which is the U.S. National Phase application under 35. U.S.C. §371 of International Application No. PCT/IB2012/052533, filed on May 21, 2012, which claims the benefit of U.S. Patent Application No. 61/491,918, filed on Jun. 1, 2011. These applications are hereby incorporated by reference herein.

BACKGROUND

Field of Invention

The present invention relates to a wafer scale process for attaching a semiconductor light emitting device to a support substrate.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 10 illustrates a light emitting diode die 110 attached to a submount 114, described in more detail in U.S. Pat. No. 6,876,008. Electrical connections between the solderable surfaces on the top and bottom surfaces of the submount are formed within the submount. The solderable areas on the top of the submount, on which solder balls 122-1 and 122-2 are disposed, are electrically connected to the solderable areas on the bottom of the submount, which attach to solder joint 138, by a conductive path within the submount. Solder joint 138 electrically connects solderable areas on the bottom of the submount to a board 134. Submount 114 may be, for example, a silicon/glass composite submount with several different regions. Silicon regions 114-2 are surrounded by metalizations 118-1 and 118-2, which form the conductive path between the top surface and the bottom surface of the submount. Circuitry such as ESD protection circuitry may be formed in the silicon regions 114-2 surrounded by metalizations 118-1 and 118-2, or in other silicon region 114-3. Such other silicon 114-3 regions may also electrically contact the die 110 or the board 134. Glass regions 114-1 electrically isolate different regions of silicon. Solder joints 138 may be electrically isolated by an insulating region 135 which may be, for example, a dielectric layer or air.

In the device illustrated in FIG. 10, the submount 114 including metalizations 118-1 and 118-2 is formed separately from die 110, before die 110 is attached to submount 114. For example, U.S. Pat. No. 6,876,008 explains that a silicon wafer, which is comprised of sites for many submounts, is grown to include any desired circuitry such as the ESD protection circuitry mentioned above. Holes are formed in the wafer by conventional masking and etching steps. A conductive layer such as a metal is formed over the wafer and in the holes. The conductive layer may then be patterned. A layer of glass is then formed over the wafer and in the holes. Portions of the glass layer and wafer are removed to expose the conductive layer. The conductive layer on the underside of the wafer may then be patterned and additional conductive layers may be added and patterned. Once the underside of the wafer is patterned, individual LED dice 110 may be physically and electrically connected to the conductive regions on the submount by interconnects 122. In other words, the LEDs 110 are attached to the submount 114 after being diced into individual diodes.

SUMMARY

It is an object of the invention to provide a wafer scale process for attaching a semiconductor light emitting device to a support substrate.

A method according to embodiments of the invention includes providing a wafer of semiconductor light emitting devices, each semiconductor light emitting device including a light emitting layer sandwiched between an n-type region and a p-type region. A wafer of support substrates is provided, each support substrate including a body. The wafer of semiconductor light emitting devices is bonded to the wafer of support substrates. Vias are formed extending through the entire thickness of the body of each support substrate.

A wafer scale process may reduce cost by permitting some processing steps conventionally performed at a die scale to be performed at a wafer scale.

DETAILED DESCRIPTION

In embodiments of the invention, a semiconductor light emitting device is bonded to a mount in a wafer scale process. Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
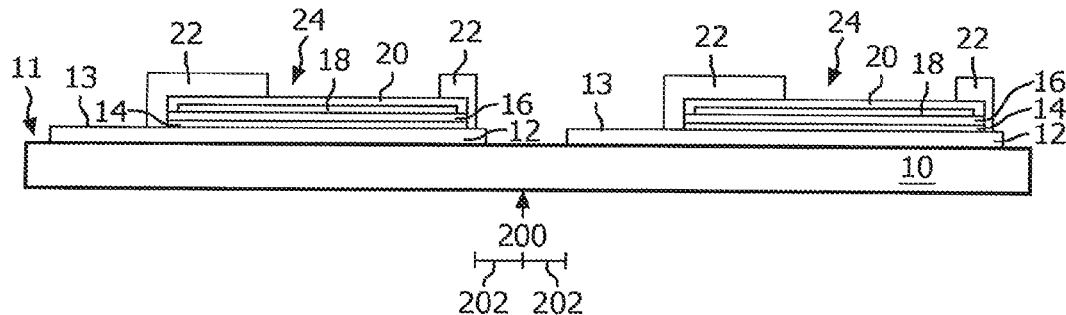
FIG. 1 illustrates a portion of a wafer of semiconductor light emitting devices. Two light emitting devices are illustrated in FIG. 1.

FIG. 1 illustrates a portion of a wafer of semiconductor light emitting devices. Two devices are illustrated in FIG. 1. To form the structure illustrated in FIG. 1, a semiconductor structure is grown over a growth substrate which may be any suitable substrate 10 such as, for example, sapphire, SiC, Si, GaN, or composite substrates. The semiconductor structure includes a light emitting or active region 14 sandwiched between n- and p-type regions 12 and 16. An n-type region 12 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical or electrical properties desirable for the light emitting region to efficiently emit light. A light emitting or active region 14 is grown over the n-type region 12. Examples of suitable light emitting regions include a single thick or thin light emitting layer, or a multiple quantum well light emitting region including multiple thin or thick light emitting layers separated by barrier layers. A p-type region 16 may then be grown over the light emitting region 14. Like the n-type region 12, the p-type region 16 may include multiple layers of different composition, thickness, and dopant concentration, including layers that are not intentionally doped, or n-type layers. The total thickness of all the semiconductor material in the device is less than 10 µm in some embodiments and less than 6 µm in some embodiments. In some embodiments the p-type region is grown first, followed by the active region, followed by the n-type region. In some embodiments, the semiconductor material may optionally be annealed at between 200° C. and 800° C. after growth.

The metal contact on the p-type region 16 is then formed. In the device of FIG. 1, the p-contact includes two metal layers 18 and 20. Metal 18 may be deposited by, for example, evaporation or sputtering, then patterned by standard photolithographic operations including, for example, etching or lift-off. Metal 18 may be a reflective metal that makes an ohmic contact with p-type III-nitride material such as, for example, silver. Metal 18 may also be a multi-layer stack of a transition metal and silver. The transition metal may be, for example, nickel. Metal 18 is between 100 Å and 2000 Å thick in some embodiments, between 500 Å and 1700 Å thick in some embodiments, and between 1000 Å and 1600 Å in some embodiments. The structure may optionally be annealed a second time after deposition of metal 18.

An optional second p-contact metal 20 may be deposited over p-contact metal 18 by, for example, evaporation or sputtering, then patterned by standard photolithographic operations such as, for example, etching or lift-off. Metal 20 may be any electrically-conductive material which reacts minimally with silver, such as, for example, an alloy of titanium and tungsten. This alloy may be nitrided either partially, wholly, or not at all. Metal 20 may alternatively be chromium, platinum or silicon, or may be a multi-layer stack of any of the above materials optimized for adhesion to surrounding layers and for blocking diffusion of metal 18. Metal 20 may be between 1000 Å and 10000 Å thick in some embodiments, between 2000 Å and 8000 Å in some embodiments, and between 2000 Å and 7000 Å thick in some embodiments.

The structure is then patterned by standard photolithographic operations and etched by, for example, reactive ion etching (ME), where chemically reactive plasma is used to remove the semiconductor material, or inductively coupled plasma (ICP) etching, an RIE process where the plasma is generated by an RF-powered magnetic field. In some embodiments, the pattern is determined by the photolithographic mask used to pattern p-contact metal 20. In these embodiments, etching may be performed subsequent to etching of p-contact metal 20 in a single operation. In some regions, the entire thickness of p-type region 16 and the entire thickness of light emitting region 14 are removed, revealing a surface 13 of n-type region 12. The n-type region 12 is then etched away in regions 11 between devices, revealing the growth substrate 10, such that the III-nitride material is set back from the edge 200 of the final devices by a distance 202. For example, the III-nitride material may be set back from the edge of the device by between 1 µm and 50 µm in some embodiments, by less than 20 µm in some embodiments, by less than 10 µm in some embodiments, and by less than 6 µm in some embodiments.

A dielectric 22 may be deposited over the structure in FIG. 1, for example by plasma-enhanced chemical vapor deposition (PECVD), chemical vapor deposition (CVD), or evaporation. Dielectric 22 provides electrical isolation for the metal contacts connected to the n-type and p-type regions. Dielectric 22 is patterned by standard photolithographic operations and etched by ICP etching or RIE to expose n-type region 12 in regions 13 and to expose p-contact metal 20 in regions 24. Dielectric 22 may also be patterned by lift-off. Dielectric 22 may be any suitable dielectric including silicon nitride, silicon oxide and silicon oxy-nitride. In some embodiments, dielectric 22 is a multi-layer dielectric stack optimized to reflect light incident upon it. Dielectric 22 may be less than 2 µm thick in some embodiments, between 200 Å and 5000 Å thick in some embodiments, and between 500 Å and 3200 Å thick in some embodiments.

Two devices are shown in FIG. 1, to illustrate that the devices described herein are formed on a wafer of devices. For simplicity, only one device is shown in FIGS. 2, 3, 4, 5, 6, 7, and 8, though it is to be understood that the structures shown in those figures are repeated across a wafer.

Figure 2:
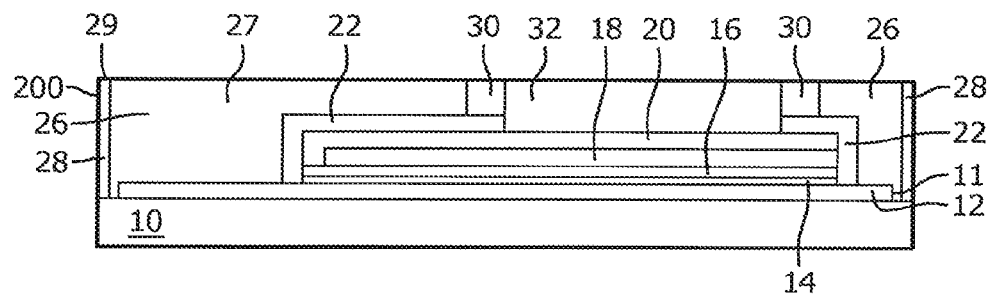
FIG. 2 illustrates one of the devices of FIG. 1 after addition of one or more metal layers and one or more polymer layers.

In FIG. 2, a metal layer 27 that forms n-contact 26 in the regions where it contacts n-type region 12 and an additional p-contact layer 32 is deposited and patterned. Metal 27 may be any suitable metal including aluminum or a multi-layer stack of metals including aluminum, titanium-tungsten alloy, copper and gold. In embodiments where metal 27 is a multi-layer stack, the first metal (i.e. the metal adjacent to n-type region 12) may be selected to form an ohmic contact to GaN and to be reflective of blue and white light. Such a first layer may be, for example, aluminum. The last metal may be a metal suitable for whatever bonding process is used to attach the device to a mount. For example, in some embodiments, the bonding process is thermocompression bonding and the last metal is gold. Metal 27 can be deposited by any suitable process including, for example, sputtering, evaporation, plating, or a combination of these processes.

Figure 9:
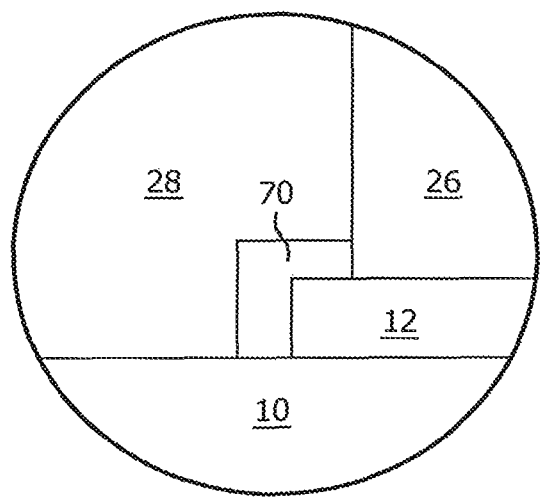
FIG. 9 illustrates a reflector formed on the edge of an n-type region.
Figure 10:
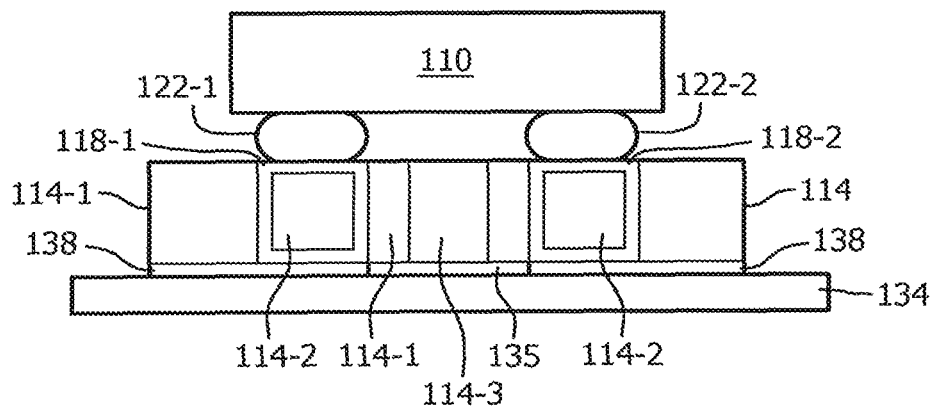
FIG. 10 illustrates a prior art device including an LED mounted on a submount.

Though in the device illustrated in FIG. 2, n-contact 26 extends over the edge of n-type region 12 and touches growth substrate 10, in some embodiments, n-contact 26 may be set back from the edge of n-type region 12 such that n-contact 26 does not cover the edge of n-type region 12. In such embodiments, polymer layer 28, described below, may be wider, such that it touches a portion of n-type region 12 not covered by n-contact 26. In some embodiments, as illustrated in FIG. 9 which shows a portion of a device, a reflective dielectric material 70 is deposited around the edges of n-type region 12. Reflective dielectric material 70 may be, for example, a reflective dielectric stack formed at the same time as dielectric 22 or formed in separate deposition and patterning steps. In any case, both n-type region 12 and n-contact 26 are set back from the edge 200 of the device.

One or more polymer layers are then deposited and patterned. Polymer layer 28 is disposed between adjacent devices. Polymer layer 30 separates p-contact 32 from n-contact 26. Polymer layers 28 and 30 may be the same material and may be deposited and patterned in the same operation, though they need not be. For example, in the device illustrated in FIG. 4, polymer layers 28 and 30 and bonding layer 42 may all be the same material deposited in a single step. In this case, the deposited material need not be patterned and planarization may not be required. In some embodiments polymer layers 28 and 30 are resistant to high temperatures. Examples of suitable materials include benzocyclobutene-based polymers, polyimide-based polymers, and epoxies. In some embodiments, polymer layer 28 is doped with a scattering component such as titanium dioxide or a light absorbing material such as carbon black. Polymer layer 28 may be silicone in some embodiments. The deposited polymer layers 28 and 30 may be planarized, for example by chemical-mechanical polishing, mechanical polishing, or fly-cutting.

Figure 3:
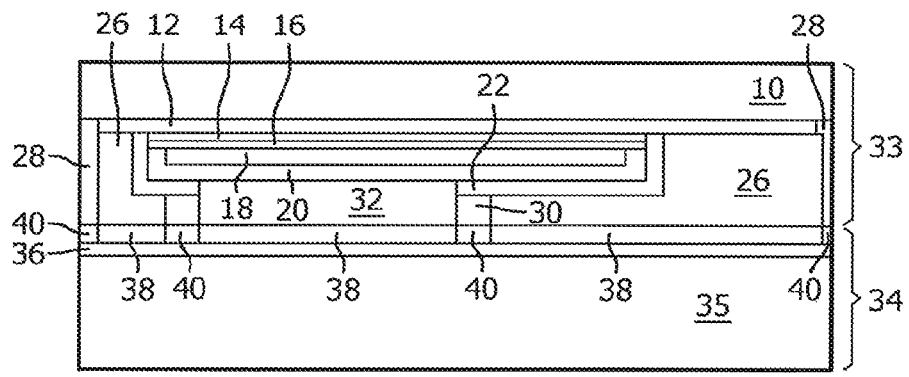
FIG. 3 illustrates a device bonded to a support substrate by a metal bond.
Figure 4:
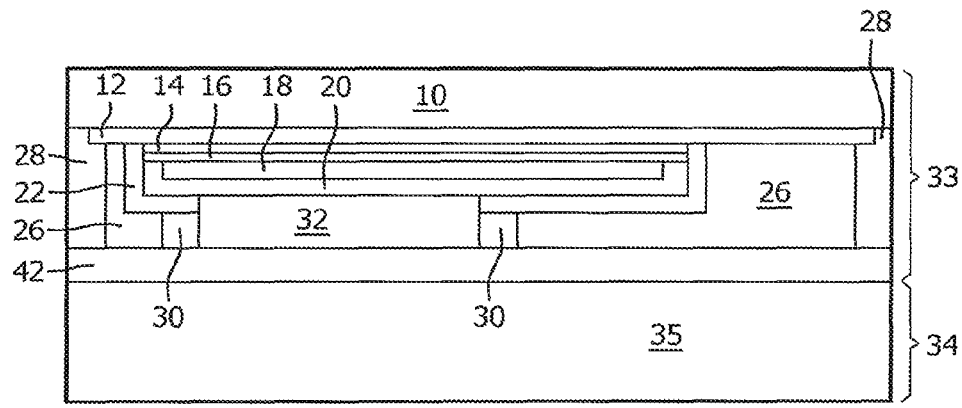
FIG. 4 illustrates a device bonded to a support substrate by a single polymer layer.
Figure 5:
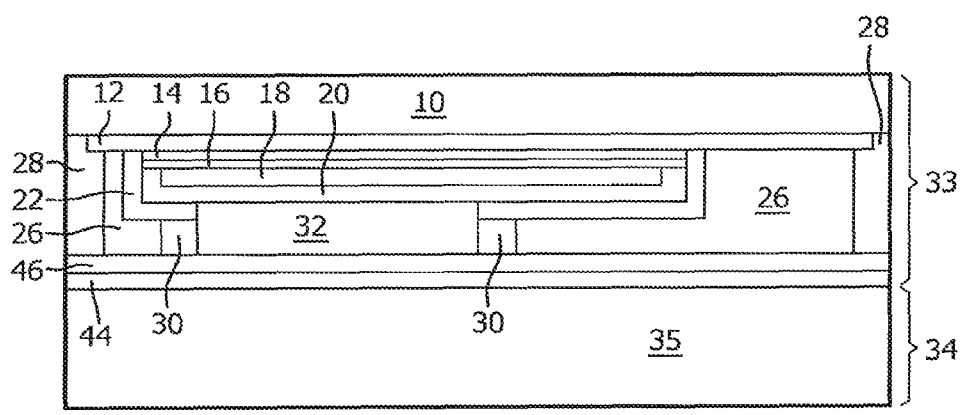
FIG. 5 illustrates a device bonded to a support substrate by dielectric layers formed on the device and the support substrate.

A wafer of the devices illustrated in FIG. 2 is flipped relative to the orientation illustrated in FIG. 2 and bonded to a wafer of support substrates. Three examples of suitable bonds between semiconductor light emitting devices 33 and support substrates 34 are illustrated in FIGS. 3, 4, and 5. The support substrates 34 illustrated in FIGS. 3, 4, and 5 include a body 35. Body may be Si, GaAs, or Ge in some embodiments, or any other suitable material. In some embodiments, electronics can be integrated into support substrate 34. Integrated elements may include, for example, circuit elements used for electrostatic discharge protection or drive electronics. Examples of suitable integrated elements include diodes, resistors, and capacitors. Integrated elements may be formed by conventional semiconductor processing techniques.

In the structure illustrated in FIG. 3, an optional dielectric 36 is grown on the support substrate 34. Dielectric 36 may be a thermally grown native oxide of body 35 (e.g. an oxide of silicon), a dielectric deposited by PECVD or CVD (e.g. an oxide, nitride, or oxy-nitride of silicon), or any other suitable dielectric. For example, a thermal oxide may be grown by heating silicon in a gaseous atmosphere containing $O_2$ and/or $H_2O$ at 800° C. to 1200° C. PECVD oxide may be grown at a temperature of 150° C. to 400° C. in an atmosphere of silane and $N_2O$ or $O_2$, or tetraethyl orthosilicate and $N_2O$ or $O_2$. CVD oxide may be grown at a temperature of 300° C. to 900° C. in an atmosphere of silane and $N_2O$ or $O_2$, or tetraethyl orthosilicate and $N_2O$ or $O_2$.

A metal 38 is deposited on dielectric 36 if present or on body 35. Metal 38 may be, for example, copper, gold, or any other suitable metal, deposited by sputtering, plating, evaporation, a combination of these techniques, or any other suitable technique. Metal 38 may also comprise a multi-layer metal stack. In embodiments where metal 38 is a multi-layer stack, the last deposited layer of the stack may be a metal suitable for use in whatever bonding technique is used to attach device 33 to support substrate 34. In some embodiments, the bonding technique is thermocompression bonding and the last deposited layer may be gold. Metal 38 may be patterned, for example through an additive process or a subtractive process.

A dielectric 40 is deposited and patterned. Dielectric 40 provides electric isolation between metal layers that are electrically connected to the n-type and p-type semiconductor layers, therefore dielectric 40 must be aligned with polymer layer 30. Dielectric 40 may be a polymer or other organic material suitable for use as a bonding material or glue. Dielectric 40 may be, for example, a benzo-cyclobutene based polymer, a polyimide-based polymer, a silicone-based polymer, an epoxy, a combination of materials, any other appropriate organic material, or an inorganic dielectric. Optionally, the top surface of support substrate 34 (i.e. the top surface of metal 38 and dielectric 40) may be planarized, for example by polishing, by chemical-mechanical polishing, or by any other suitable process.

In the structure illustrated in FIG. 4, a single dielectric bonding layer 42 is formed over the top surface of the structure illustrated in FIG. 2 (i.e. the top surface of metal layers 26 and 32 and polymer layers 28 and 30). Alternatively, dielectric 42 may be formed on body 35 of support substrate 34. Dielectric 42 may be a polymer or other organic material suitable for use as a bonding material or glue. Dielectric 42 may be a benzo-cyclobutene based polymer, a polyimide-based polymer, an epoxy, a silicone-based polymer, or any other appropriate organic material. Dielectric 42 may be the same material as polymer layers 28 and 30, though it need not be. Dielectric 42 may be formed by, for example, spin coating, and may be planarized after deposition, for example by chemical-mechanical polishing, mechanical polishing, or fly-cutting. In embodiments where dielectric 42 is the same material as polymer layers 28 and 30, the device may be planarized in a single step after co-deposition, for example by chemical-mechanical polishing. In some embodiments, planarization of dielectric 42 is not required. Dielectric 42 may be between 100 Å and 1 μm thick over metal layers 26 and 32, and planar across the entire wafer.

In the device illustrated in FIG. 5, bonding layers 44 and 46 are formed on both the body 35 and the device 33, respectively. Bonding layer 46 formed on device 33 may be a dielectric such as, for example, an oxide of silicon deposited at low temperature, for example by PECVD, a silicon nitride or a silicone oxy-nitride. For example, PECVD oxide may be grown at a temperature of 150° C. to 400° C. in an atmosphere of silane and $N_2O$ or $O_2$, or tetraethyl orthosilicate and $N_2O$ or $O_2$. Dielectric 46 may be between 100 Å and 1 μm thick in some embodiments. Bonding layer 44 formed on support substrate 34 may be a dielectric such as, for example, an oxide of silicon, a silicon nitride, or a silicon oxy-nitride. An oxide of silicon may be a thermally grown oxide on a silicon support substrate, deposited at high temperature, for example by CVD, or deposited at low temperature, for example by PECVD. Dielectric 44 may be between 100 Å and 1 μm thick in some embodiments. For example, thermal oxide may be grown by heating the silicon in a gaseous atmosphere containing $O_2$ and/or $H_2O$ at 800° C. to 1200° C. PECVD oxide may be deposited at a temperature of 150° C. to 400° C. in an atmosphere of silane and $N_2O$ or $O_2$, or tetraethyl orthosilicate and $N_2O$ or $O_2$. CVD oxide may be deposited at a temperature of 300° C. to 900° C. in an atmosphere of silane and $N_2O$ or $O_2$, or tetraethyl orthosilicate and $N_2O$ or $O_2$.

A wafer of devices 33 is bonded to a wafer of support substrates 34 by, for example, one of the bonding structures illustrated in FIGS. 3, 4, and 5. Bonding may be performed at a temperature between 50° C. and 500° C. in some embodiments and between 100° C. and 250° C. in some embodiments. Bonding may be performed under an applied compressive pressure of less than 5 MPa in some embodiments. In some embodiments, after bonding to the wafer of support substrates 34, the growth substrate 10 may be removed from device 33 by, for example, etching or laser lift-off. In embodiments where the growth substrate 10 is removed, support substrate 34 provides mechanical support to the device 33, since the device without the growth substrate is typically so thin that it is not mechanically self-supporting. For example, the total thickness of the device illustrated in FIG. 2 without the substrate is no more than 7 µm in some embodiments and no more than 25 µm in some embodiments. The semiconductor material exposed by removing growth substrate 10 may be patterned or roughened by any suitable process such as photoelectrochemical etching, for example to enhance light extraction. In some embodiments, the growth substrate 10 remains part of the final device. In some embodiments, the growth substrate may be shaped, for example by sawing or etching. The body 35 of support substrate 34 may be thinned to a thickness between 50 µm and 250 µm in some embodiments and between 80 µm and 120 µm in some embodiments, before or after bonding to device 33. Thinning may be performed by, for example, chemical mechanical polishing or grinding and polishing.

Figure 6:
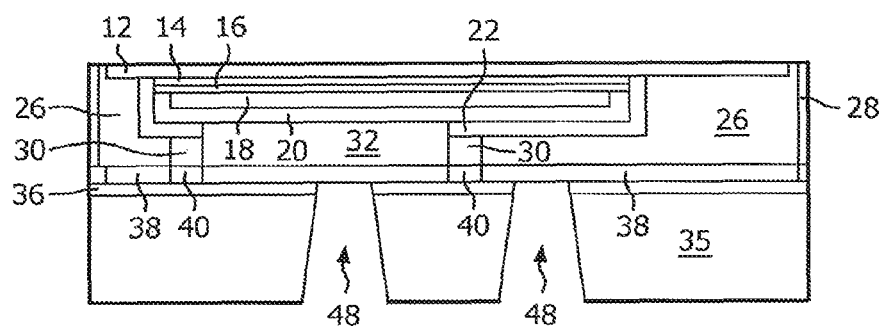
FIG. 6 illustrates the structure of FIG. 3 after forming vias in the body of the support substrate.
Figure 7:
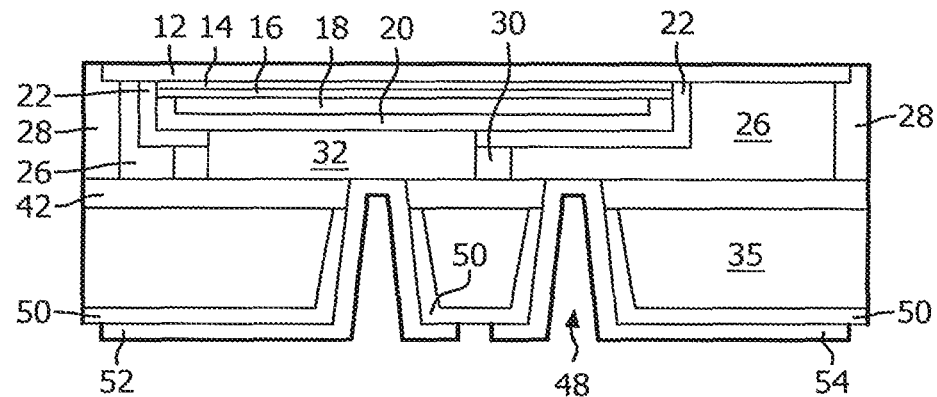
FIG. 7 illustrates the structure of FIG. 4 after forming vias and patterned metal and dielectric layers.
Figure 8:
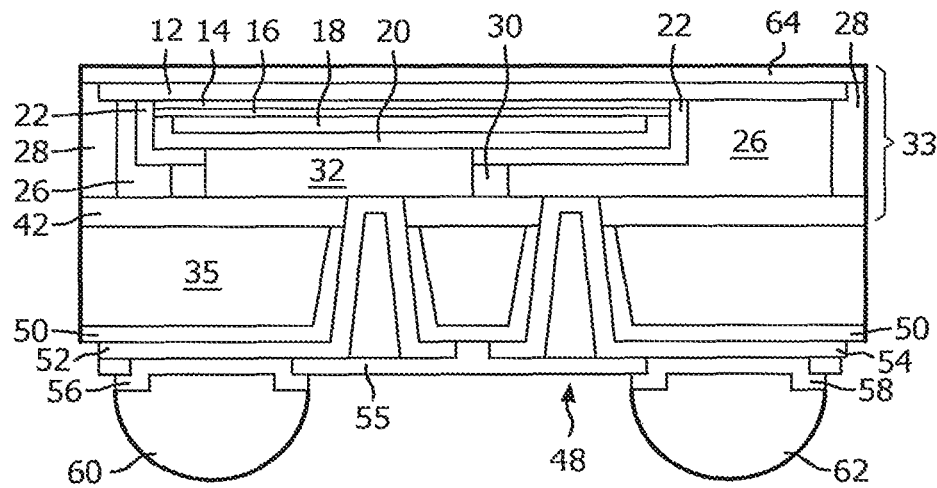
FIG. 8 illustrates the structure of FIG. 7 after forming additional patterned metal and dielectric layers and attaching solder bumps and a wavelength converting layer.

After bonding, vias are formed in the support substrate and the bonded structure undergoes further processing, as illustrated in FIGS. 6, 7, and 8. FIG. 6 illustrates vias formed in the device illustrated in FIG. 3. FIGS. 7 and 8 illustrate vias and metal and dielectric layers formed on the device illustrated in FIG. 4. The processing illustrated in FIGS. 6, 7, and 8 may be performed on any of the devices illustrated in FIGS. 3, 4, and 5.

As illustrated in FIG. 6, vias 48 are etched through body 35 of support substrate 34. Two vias are illustrated, one that reveals a metal electrically connected to the n-type region 12 and one that reveals a metal electrically connected to the p-type region 16. In the device illustrated in FIG. 6 (which includes the bond illustrated in FIG. 3), vias 48 are etched through body 35 and optional dielectric 36 to reveal metal layer 38. In the devices illustrated in FIGS. 4 and 5, vias are etched through bonding layers 42, 44, and 46 to reveal p-metal 32 and n-metal 26. Vias 48 may be etched by, for example, deep reactive ion etching, reactive ion etching, wet chemical etching, or any other suitable etching technique. In embodiments where support substrate 34 is Si, suitable etchant gases include, for example, $SF_6$ and etching may be time-multiplexed with deposition of a chemically inert passivation layer on the Si sidewalls using, for example, Octafluorocyclobutane in a process commonly referred to as the Bosch Process. In embodiments where support substrate 34 is GaAs, suitable etchant gasses include, for example, $Cl_2$, HBr or a mixture of $Cl_2$ and HBr. In embodiments where support substrate 34 is Ge, suitable etchant gasses include, for example, $Cl_2$, $SCl_4$ or a mixture of $Cl_2$ and $SCl_4$. In embodiments where support substrate 34 is GaAs or Ge, etching may also be time-multiplexed with deposition of a chemically inert passivation layer on the sidewalls. The sidewalls of vias 48 may be orthogonal with respect to body 35 or angled as shown in FIG. 6.

As illustrated in FIG. 7, a dielectric 50 is then deposited on the surface of body 35 and in vias 48. Dielectric 50 may be, for example, an oxide of silicon, a nitride of silicon, or an oxy-nitride of silicon deposited at low temperature, for example by PECVD. For example, PECVD oxide may be deposited at a temperature of 150° C. to 400° C. in an atmosphere of silane and $N_2O$ or $O_2$, or tetraethyl orthosilicate and $N_2O$ or $O_2$. Dielectric 50 may be between 100 Å and 2 µm thick in some embodiments. Dielectric 50 is subsequently patterned to expose the metal layers 32 and 26 at the top of vias 48.

A metal layer is deposited then patterned to form electrical connections 52 and 54 to the p- and n-contacts. Electrical connections 52 and 54 may be, for example, Cu deposited by, for example, plating, sputtering, or a combination of sputtering and plating. Electrical connections 52 and 54 may be between 1 µm and 20 µm thick in some embodiments and between 6 µm and 10 µm thick in some embodiments. In the cross section shown in FIG. 7, vias 48 are not fully filled by electrical connections 52 and 54. In some embodiments, the portion of vias 48 not occupied by dielectric 50 may be completely filled by electrical connections 52 and 54. The metal layer that forms electrical connections 52 and 54 may be a multi-layer metal stack comprising, for example Ti, TiW, Cu, Ni, and Au, deposited by sputtering, or by a combination of sputtering and plating.

As illustrated in FIG. 8, a dielectric 55 is deposited and patterned to electrically isolate and/or protect electrical connections 52 and 54. Dielectric 55 may be, for example, one or more benzo-cyclobutene based polymers or one or more polyimide-based polymers. In embodiments where vias 48 have not been completely filled by the metal layer forming electrical connections 52 and 54, dielectric 55 may be configured to mostly or totally fill vias 48, or vias 48 may be left unfilled.

Optionally, an additional metal layer is then deposited to form solder connections 56 and 58. The additional metal may be any metal that is suitable as a connection between electrical connections 52 and 54 and interconnects 60 and 62, which are solder bumps in some embodiments. Examples of suitable structures for solder connections 56 and 58 include a first layer of sputtered NiV or plated Ni followed by a second thin layer of sputtered or plated Au, a first layer of sputtered TiW followed by a second layer of sputtered NiV or plated Ni followed by a third thin layer of sputtered or plated Au, or a first layer of sputtered or plated TiW followed by a second layer of plated Cu followed by a third layer of sputtered or plated Au. Solder connections 56 and 58 may have a total thickness between 1 µm and 15 µm in some embodiments.

In some embodiments, a wavelength converting layer 64 is disposed over the light emitting layer 14 in the path of light emitted by the light emitting layer. Wavelength converting layer 64 may be spaced apart from the device, attached to n-type region 12 if the growth substrate 10 has been removed, or attached to the growth substrate 10 if present. The wavelength converting layer includes one or more wavelength converting materials configured to absorb light emitted by the light emitting layer and emit light of a different wavelength. All or only a portion of the light emitted by the light emitting layer and incident on the wavelength converting layer may be converted by the wavelength converting materials. Unconverted light emitted by the light emitting layer may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device.

Wavelength converting layer 64 may be, for example, a layer of phosphor particles in a silicone matrix deposited on the wafer, for example by lamination. The wavelength converting layer thickness may be between 10 μm and 100 μm in some embodiments, between 15 μm and 50 μm in some embodiments, and between 18 μm and 30 μm in some embodiments. Wavelength converting layer 64 may be, for example, a powdered phosphor or quantum dots in an organic or inorganic encapsulant deposited over the device for example by spray coating, electrophoresis, overmolding, stenciling, screen or ink jet printing, sedimentation, evaporation, sputtering, or any other suitable technique. Wavelength converting layer 64 may be, for example, a preformed, self-supporting layer such as a solid ceramic phosphor formed by sintering or a glass-based phosphor. Such self-supporting layers may be bonded directly to the device without an adhesive or bonded via an adhesive such as a silicone glue. In some embodiments, wavelength converting layer 64 may be a multi-layer structure comprising a first high-refractive index spacer material deposited or bonded directly to the n-type region 12 and a phosphor layer deposited on top of the spacer material. Examples of suitable phosphors include doped yttrium aluminum garnet-based phosphor, nitride-based phosphors, and any other suitable phosphors.

In some embodiments, wavelength converting layer 64 is the only wavelength converting material in the device. In some embodiments, wavelength converting layer 64 is combined with other wavelength converting elements such as other phosphors, quantum dots, semiconductor wavelength converting elements, or dyes to create white light or monochromatic light of other colors.

In some embodiments, optional interconnects 60 and 62, suitable for attaching the structure shown in FIG. 8 to another structure such as a printed circuit board, are formed on connections 56 and 58. Interconnects 60 and 62 are often solder bumps but any suitable interconnect may be used. Solder bumps 60 and 62 may be, for example, an alloy of tin, silver and copper (SAC solder) or an alloy of gold and tin. The solder may be applied by any suitable technique including, for example, plating. After plating, the structure may subsequently be reflowed to smooth the structure and microstructure of the solder bumps 60 and 62.

A wafer of devices 33 bonded to support substrates 34 may then be diced into individual light emitting device chips. Since the devices 33 and support substrates 34 are diced together, the support substrate is no wider than the device, as illustrated in FIGS. 3, 4, 5, 6, 7, and 8. Singulation may be performed, for example, by conventionally sawing, by laser ablation using 193 nm, 248 nm, or 355 nm light, or by water jet cutting. Singulation may also be performed via a combination of scribing and mechanical breaking, scribing being performed, for example, by conventionally sawing, by laser ablation using 193 nm, 248 nm, or 355 nm light, or by water jet cutting.

Since the above-described devices are bonded to the support substrates on a wafer scale, embodiments of the invention may provide efficiencies and cost reduction over conventional schemes in which the device is bonded to a support substrate die-by-die. For example, efficiencies may arise due to the possibility of wafer-level processing of LEDs through many processing operations typically performed at the package level in conventional LEDs including growth substrate removal, roughening of the semiconductor surface after growth substrate removal, and forming a wavelength converting layer.

In a conventional semiconductor vertical integration schemes, the devices being integrated are often nominally the same materials, or materials having similar coefficients of thermal expansion (CTEs). As such, wafer bonding of the structures can be performed at elevated temperatures. In the case of a III-nitride device grown on sapphire and wafer bonded to a silicon support substrate wafer, the CTEs of the sapphire and silicon are sufficiently different that wafer bonding at elevated temperatures can result in significant stresses being locked into the bonded structures, resulting in bowing and breaking of the bonded structures during subsequent processing. In some above-described embodiments, the devices are bonded to the support substrates at low temperature, which may result in minimal locked-in stresses in the structure, which may improve yield. For example, bonding is performed at less than 300° C. in some embodiments and between 230° C. and 275° C. or lower in some embodiments. In some embodiments using silicone-based bonding layers, bonding may be performed at less than 150° C.

In some embodiments, since the support substrate wafer includes no features at the time of bonding, the wafer of devices can be bonded to the support substrate wafer without detailed alignment. The device and support substrate wafers merely have to be roughly aligned, for example by visual alignment, but do not require fine alignment of patterned features on the two wafers. After bonding, the via etch mask has to be aligned to the LED metallizations, which can be performed through IR alignment (which looks through the bonded wafers) or backside alignment (which aligns a mask on the support substrate wafer side with a view of the LED pattern as seen through a transparent growth substrate such as sapphire).

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:
1. A device comprising:
 a semiconductor light emitting device comprising:
  a light emitting layer sandwiched between an n-type region and a p-type region;
  an n-contact disposed on the n-type region, wherein the n-contact comprises a continuous metal or stack of metals that is set back from an edge of the n-type region such that the n-contact does not cover the edge of the n-type region; and
  a reflective dielectric layer disposed on said edge of the n-type region;

a support substrate comprising a body, wherein a width of the support substrate is the same as a width of the semiconductor light emitting device; and a plurality of vias formed in the body.

2. The device of claim 1 wherein the reflective dielectric layer extends over the edge of the n-type region and covers a sidewall of the n-type region.

3. The device of claim 1 wherein the reflective dielectric layer is a reflective dielectric stack.

4. The device of claim 1 wherein the vias extend completely through the body and expose a metal layer at tops of the vias.

5. The device of claim 1 further comprising a passivation layer formed on sidewalls of the vias.

6. The device of claim 1 wherein the vias have angled sidewalls.

7. The device of claim 1 further comprising a polymer layer disposed over the reflective dielectric layer in direct contact with the reflective dielectric layer.

8. The device of claim 7 wherein the polymer layer is doped with a light absorbing material.

9. The device of claim 7 wherein the polymer is doped with a light scattering material.

10. The device of claim 1 further comprising a dielectric layer disposed on sidewalls of the vias, wherein the dielectric layer is patterned to expose a metal layer at tops of the vias.

11. The device of claim 10 further comprising a metal disposed in the vias overlying the dielectric layer.

12. The device of claim 11 wherein the metal is copper.

13. The device of claim 11 wherein the metal is disposed on a surface of the body outside the vias, and the metal disposed on the surface of the body is between 1 µm and 20 µm thick.

14. The device of claim 11 wherein the metal completely fills the vias.

15. The device of claim 11 wherein the metal does not completely fill the vias.

* * * * *